(12) United States Patent
Koteles

(10) Patent No.: US 6,757,100 B2
(45) Date of Patent: Jun. 29, 2004

(54) CASCADED SEMICONDUCTOR OPTICAL AMPLIFIER

(75) Inventor: Emil S. Koteles, Ottawa (CA)

(73) Assignee: MetroPhotonics Inc., Ottawa (CA)

(*) Notice: Subject to any disclaimer, the term of this patent is extended or adjusted under 35 U.S.C. 154(b) by 123 days.

(21) Appl. No.: 10/073,042

(22) Filed: Feb. 12, 2002

(65) Prior Publication Data

US 2002/0109889 A1 Aug. 15, 2002

Related U.S. Application Data

(60) Provisional application No. 60/267,701, filed on Feb. 12, 2001.

(51) Int. Cl.[7] .................................................. H01S 1/30
(52) U.S. Cl. ........................................................ 359/344
(58) Field of Search ............................. 359/344; 372/45, 372/49, 50

(56) References Cited

U.S. PATENT DOCUMENTS 4,794,346 A * 12/1988 Miller ........................ 330/4.3
6,186,631 B1 * 2/2001 Behringer et al. .......... 357/344
6,249,373 B1 * 6/2001 Woodward .................. 359/344

* cited by examiner

Primary Examiner—Mark Hellner
(74) Attorney, Agent, or Firm—Freedman & Associates

(57) ABSTRACT

The present invention relates to a semiconductor optical amplifier system integrated within a semiconductor waveguide structure. The semiconductor optical amplifier system comprises a first semiconductor optical amplifier having a first spectral response and a second semiconductor optical amplifier having a second other spectral response. The second semiconductor optical amplifier is coupled to the first semiconductor optical amplifier for optically receiving an amplified optical signal from the first semiconductor optical amplifier. The center wavelengths of the first and the second spectral response are selected such that an optical signal provided to the first semiconductor optical amplifier and amplified thereby and then provided to the second semiconductor optical amplifier and amplified thereby is amplified approximately a same amount across a band of wavelengths larger than the band of wavelengths across which the optical signal was amplified approximately consistently by the first semiconductor optical amplifier alone.

19 Claims, 15 Drawing Sheets

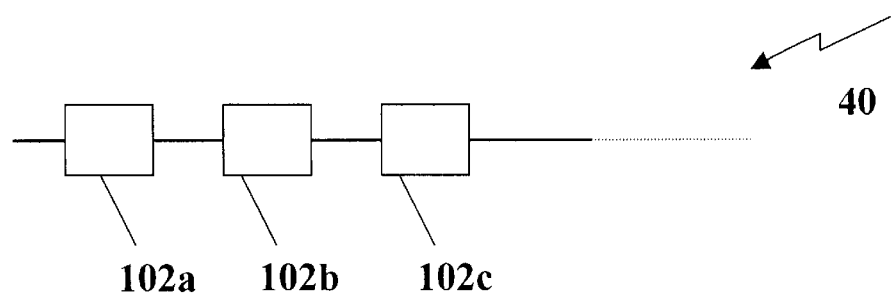
Fig. 11
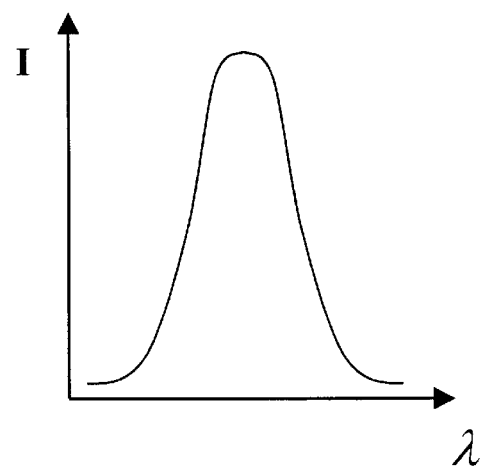 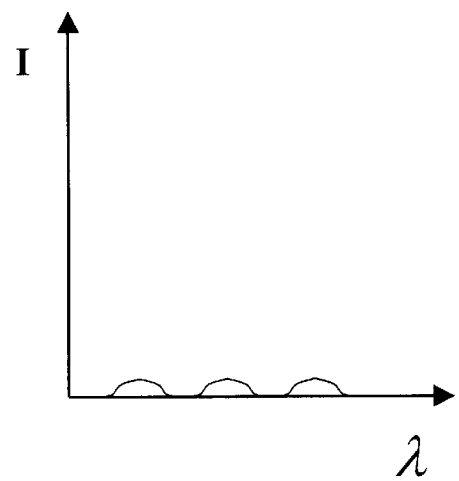
Fig. 12a          Fig. 12b

CASCADED SEMICONDUCTOR OPTICAL AMPLIFIER

This patent application is based upon U.S. Provisional Patent Application No. 60/267,701, filed on Feb. 12, 2001.

FIELD OF THE INVENTION

This invention relates generally to semiconductor optical waveguide devices and more particularly to shaping of the overall spectral response of the device by cascading a plurality of semiconductor optical amplifiers.

BACKGROUND OF THE INVENTION

Fiber optic communications systems have gained widespread acceptance over the past few decades. With the advent of optical fiber, communication signals are transmitted as light propagating along a fiber supporting total internal reflection of the light propagating therein. Many communication systems rely on optical communications because they are less susceptible to noise induced by external sources and are capable of supporting very high speed carrier signals and increased bandwidth. Unfortunately, optical fiber components are bulky and often require hand assembly resulting in lower yield and higher costs. One modern approach to automating manufacture in the field of communications is integration. Integrated electronic circuits (ICs) are well known and their widespread use in every field is a clear indication of their cost effectiveness and robustness. A similar approach to optical communication components could prove very helpful.

Unfortunately, integrated optical devices are generally quite lossy. In order to compensate for the performance of a lossy device, one approach is to use optical amplifiers to amplify the light provided to the lossy component. However, because of non uniformities in optical amplification and in optical response of an integrated component, results vary and generally, this approach is not used with repeatable and easily manufacturable results.

Due to these non-uniformities, each optical component has a typical spectral response, i.e. the effect of the component upon a light signal depends upon the wavelength of the light signal. For example, an optical amplifier produces differing gains for different wavelength channels when it is pumped. Using this technology requires some means of ensuring that the different wavelength channels each receive the same amount of optical amplification. To compensate for the differing gains, a gain flattening filter is introduced to the amplifier assembly. The spectral response of this filter is used to flatten the amplification of the optical amplifier.

One way of boosting the total bandwidth of an optical network is using wavelength division multiplexing or WDM. This technology allows many different wavelength channels, each with its own signal to use the same fiber. As the need for bandwidth increases the designers of the WDM components try to add more support for more channels to their products. As more and more channels are added it becomes harder to separate them and special care has to be taken for ensuring signal quality, i.e. substantially equal intensity of the channel wavelengths and separation between channels. If they are not properly separated then they begin to inadvertently share signals. Also, as the number of channels increases the components that are needed to separate the individual channels becomes more complex and difficult to build.

In U.S. Pat. No. 5,422,968 filed Mar. 4, 1994, Hanatami et al. discuss the advantages of combining an optical demultiplexer with optical amplifiers. In this patent, the technology used for wavelength demultiplexing appears to be the thin film filter. That is, a single multiplexed signal is broken up into two output signals with differing wavelength characteristics. The authors explain the advantages of adding optical amplifiers to this system for the purposes of ensuring a proper signal to noise ratio as well as locating the amplifiers between the demultiplexing elements within the optical circuit. While this design takes advantages of optical amplifiers in a demultiplexing system it ignores the advantages of integrating the amplifiers and the wavelength dispersive elements. Additionally, the optical amplifiers are sufficiently powerful to overcome the attenuation of the other components and produce an assembly that amplifies the signals entering it. While this appears advantageous, a bulk optic assembly such as this is not practical. The components are all separate and very expensive. The combining of these components is time consuming. Additionally, the finished assembly must be sufficiently large to accommodate the optical amplifiers, the demultiplexers and the optical waveguides used to connect them.

A common method of achieving the required functionality typically relies on a hybrid integration of discrete passive devices such as an optical spectral analyzer and active devices such as amplifiers and attenuators. The search for more compact and cost efficient solutions has resulted in developing integrated planar waveguide components as disclosed, for example, in C. R. Doerr et al, *Dynamic Wavelength Equalizer in Silica Using the Single-Filtered-Arm Interferometer*, IEEE Photon. Technol. Lett., Vol. 11, pp. 581–583, 1999, and P. M J. Schiffer et al, *Smart Dynamic Wavelength Equalizer with On-Chip Spectrum Analyzer*, IEEE Photon. Technol. Lett, Vol. 12, pp. 1019–1021, 2000. In these components, the optical spectral analyzer most commonly is either the arrayed waveguide grating or waveguide echelle grating and active devices are integrated within the passive ridge waveguides, physically separating the individual wavelength channels as illustrated, for example, in E. S. Koteles, *Integrated Planar Waveguide Demultiplexers for High Density WDMA applications*, Proc. SPIE, 1999. As a result, a compact and inexpensive integrated component for use in WDM systems is produced.

It would be advantageous to use integration such as monolithic integration for providing integrated planar waveguide components comprising a plurality of cascaded amplifiers having a different spectral response. The combination of the different spectral responses allows the design of integrated optical components having equal gain and, furthermore, allows compensating for spectral responses of passive optical elements. This technology would be highly beneficial for modern high capacity bandwidth optical networks because it provides means for accurately designing integrated optical components having an overall spectral response ensuring channel separation as well as substantially equal intensity over a channel bandwidth.

It is, therefore, an object of the invention to provide an integrated planar waveguide device having a desired overall spectral response by using a plurality of cascaded amplifiers.

It is further an object of the invention to provide a method for compensating the spectral response of passive optical elements using the cascaded amplifiers.

SUMMARY OF THE INVENTION

In accordance with the present invention there is provided a semiconductor optical amplifier comprising:

a semiconductor waveguide structure;

a first semiconductor optical amplifier integrated in the semiconductor waveguide structure, the first semiconductor optical amplifier having a first spectral response; and, a second semiconductor optical amplifier integrated in the semiconductor waveguide structure and coupled for optically receiving an amplified optical signal from the first semiconductor optical amplifier, the second semiconductor optical amplifier having a second other spectral response.

In accordance with the present invention there is further provided an integrated semiconductor waveguide structure comprising:

a first semiconductor optical amplifier for amplifying an optical input signal, the first semiconductor optical amplifier having a first spectral response;

a second semiconductor optical amplifier coupled for optically receiving the amplified optical input signal from the first semiconductor optical amplifier, the second semiconductor optical amplifier having a second other spectral response; and, a demultiplexer optically coupled to the second semiconductor amplifier, the demultiplexer for separating the amplified optical input signal into a plurality of optical signals within different wavelength channels.

In accordance with an aspect of the present invention there is provided a method for designing an integrated semiconductor waveguide device comprising the steps of:

providing design parameters of an optical element of the integrated semiconductor waveguide device;

providing design parameters of a first and a second semiconductor optical amplifier optically coupled to the optical element;

determining a spectral response of the optical element in dependence upon the design parameters of the optical element;

determining a spectral response of the first and the second semiconductor optical amplifier; and, determining an overall spectral response by multiplying the spectral response of the optical element and the spectral responses of the first and the second semiconductor optical amplifier.

Using the cascaded SOAs for optical amplification according to the invention is highly advantageous by providing a large number of design possibilities for shaping the spectral response of an integrated optical device without inducing a considerable increase in cost. Furthermore, it allows the combination with optical components having a less optimal spectral response but are easier and consequently cheaper to manufacture and use of the cascaded SOAs to produce a desired overall spectral response of the device.

BRIEF DESCRIPTION OF THE FIGURES

Exemplary embodiments of the invention will now be described in conjunction with the following drawings, in which:

FIG. 7b is a simplified diagram illustrating the product of the spectral responses shown in FIG. 7a;

FIG. 11 is a simplified schematic diagram of an integrated optical amplification system according to the invention;

FIG. 12a is a simplified diagram illustrating a first spectral response of an optical amplifier of the plurality of optical amplifiers shown in FIG. 11;

FIG. 12b is a simplified diagram illustrating a second spectral response of an optical amplifier of the plurality of optical amplifiers shown in FIG. 11;

DETAILED DESCRIPTION OF THE INVENTION

Integrated wavelength multi/demultiplexers are important components for wavelength division multiplexing (WDM)

optical communication systems. Two types of integrated wavelength multi/demultiplexers that have been widely investigated are phased waveguide arrays and etched grating-on-a-chip spectrometers. Grating based devices require high quality, deeply etched grating facets. The optical loss of the device depends critically on the verticality and smoothness of the grating facets. However, the size of the grating device is much smaller than the phased array and the spectral finesse is much higher due to the fact that the number of teeth in the grating is much larger than the number of waveguides in the phased array. This allows the grating based device to have a larger number of channels available over its free spectral range (FSR) and consequently can be scaled-up easily to high density operation. Integration offers the advantages of compactness, reliability, and reduced packaging costs. Further, implementation in a semiconductor material, particularly the InGaAsP/InP system important for optical fiber communications systems, allows monolithic integration of these passive devices with active ones, such as lasers, modulators, optical switches, and detectors, resulting in sophisticated wavelength sensitive photonic integrated circuits with complex functionalities.

Figure 1:
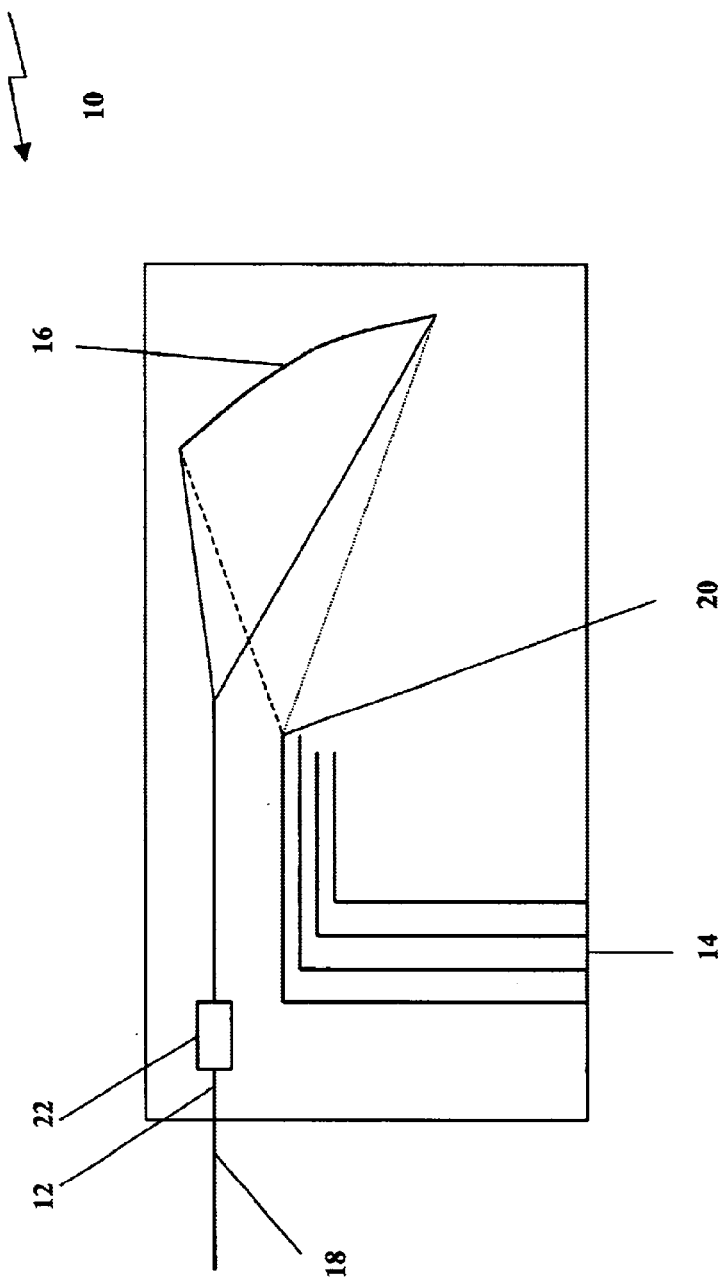
FIG. 1 is a simplified schematic diagram of a prior art integrated semiconductor waveguide device having an optical amplifier integral thereto and a diffraction grating device.

Referring now to prior art FIG. 1, a schematic of a wavelength demultiplexer 10 based on an integrated diffraction grating is shown. It comprises input waveguide 12, output waveguide array 14 and an etched diffraction grating 16. Incoming optical signals of different wavelengths are coupled from an optical fiber 18 to the input end of the input waveguide 12 of the demultiplexer 10. At the end of the input waveguide, the light diverges into the slab waveguide and is then focused back to the inputs of the output waveguides by the curved echelle grating 16. Due to the dispersive property of the diffraction grating 16, light signals of different wavelengths are focused onto different input ends of the output waveguides 14. For a given wavelength, the position of the focused spot, for example the location 20, depends on the effective index of the slab waveguide, in addition to geometrical parameters of the diffraction grating 16.

Also included within the integrated device 10 is an optical amplifier in the form of a semiconductor optical amplifier (SOA) 22. The SOA 22 acts to increase an intensity of the signal received at the input port for provision to the diffraction grating 16. Because the diffraction grating 16 imparts a loss, typically around 2 dB, to the optical signal, the SOA compensates for that loss. Further, since the loss is easily estimated during optical waveguide design, the SOA is selected to compensate for the estimated loss within design parameters.

Figure 2A:
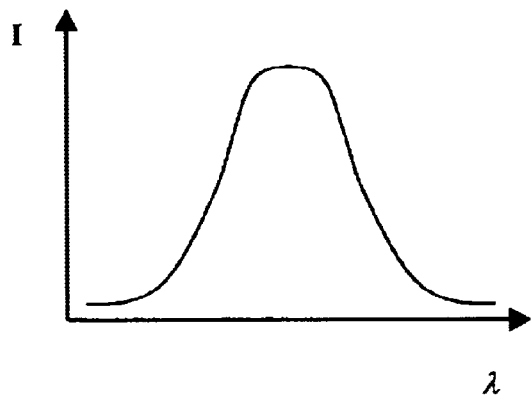
FIG. 2a is a simplified diagram illustrating the spectral response for the optical amplifier of FIG. 1.
Figure 2B:
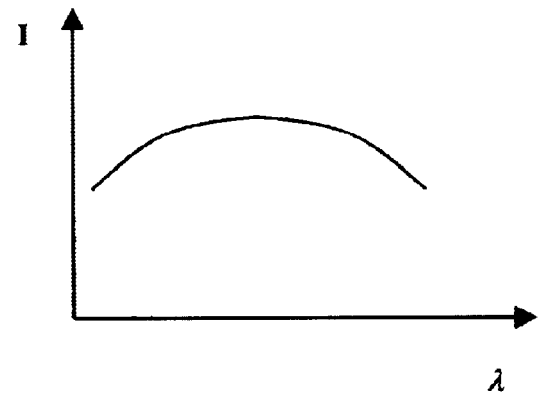
FIG. 2b is a simplified diagram illustrating the spectral response for the diffraction grating device of FIG. 1.

Referring to FIG. 2a, a typical spectral response for a SOA is shown. The SOA has excellent amplification over a spectral band and the amplification trails off outside the band of wavelengths. Even within the band of wavelengths, the optical amplification is other than identical—having a peak at a center wavelength and decreasing towards the upper and lower ends of the band. In FIG. 2b, the spectral response of a diffraction grating is shown. For a typical diffraction grating, the center channels pass through with minimal loss while the outermost channels have up to a 3 dB loss relative to the center channels. Typically, the outer channels are not used because the extra 3 dB of loss is often considered prohibitive.

Figure 2C:
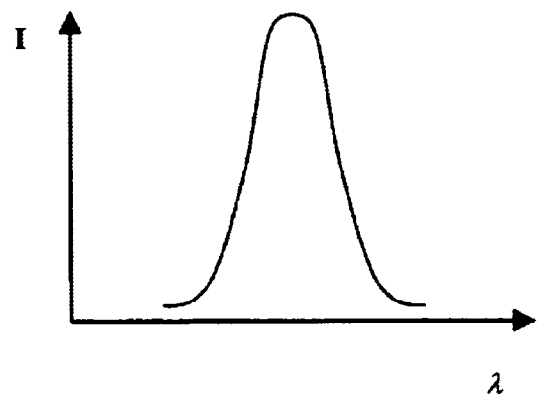
FIG. 2c is a simplified diagram illustrating the resultant spectral response for the entire integrated waveguide device of FIG. 1.

In FIG. 2c is shown the spectral response of the device 10 shown in FIG. 1. The spectral response is a product of multiplying the two spectral responses resulting in a slightly sharper peak than the spectral response of the SOA alone.

Figure 3:
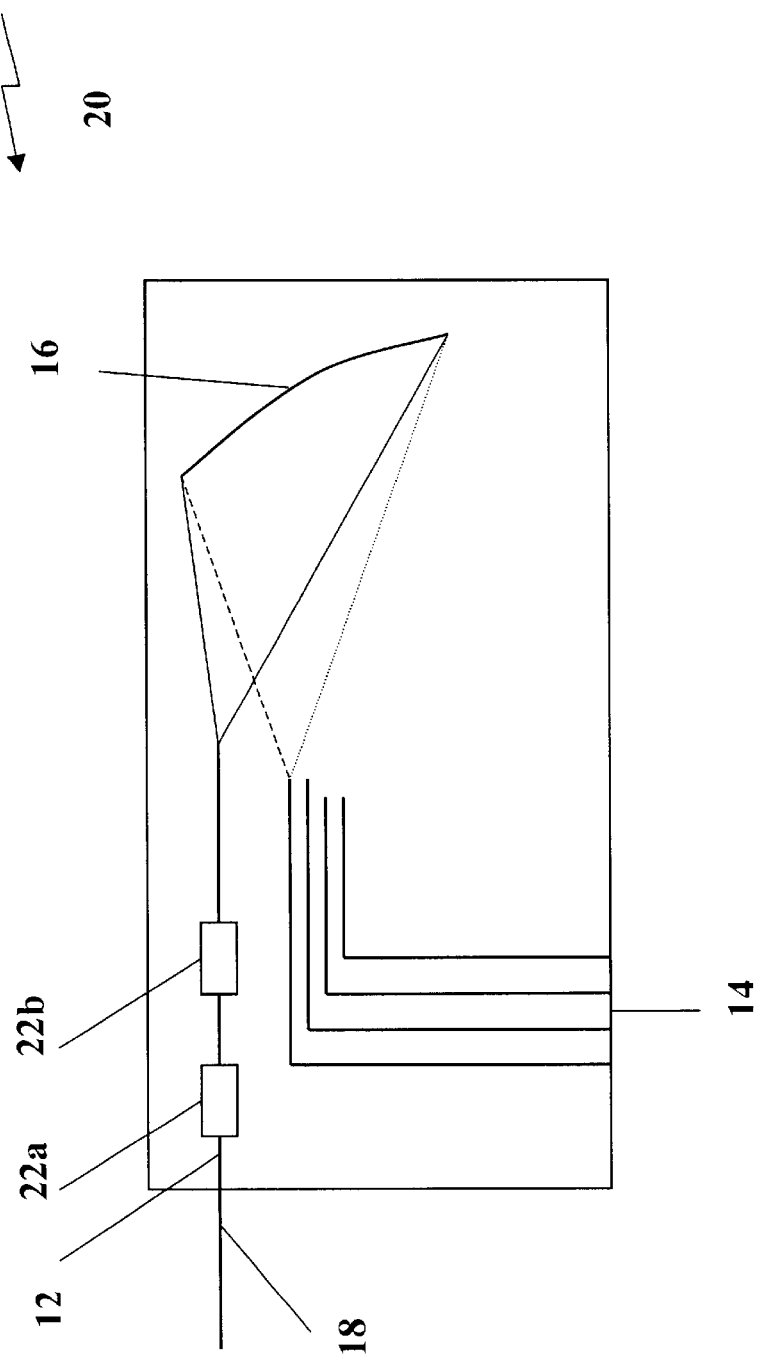
FIG. 3 is a simplified schematic diagram of an integrated semiconductor waveguide device according to the invention having two different optical amplifiers integral thereto and a diffraction grating device.

Referring to FIG. 3, an integrated semiconductor waveguide device 20 according to the invention is shown having two cascaded optical amplifiers 22a and 22b in the form of SOAs having different spectral responses. The use of two SOAs allows for increased amplification and also allows for spectral response shaping as described hereinbelow. SOAs having different spectral responses are obtained, for example, by varying material composition, doping concentration and thickness. Using modern semiconductor technology it is possible to design and reproducibly manufacture a SOA having a predictable spectral response.

Figure 4A:
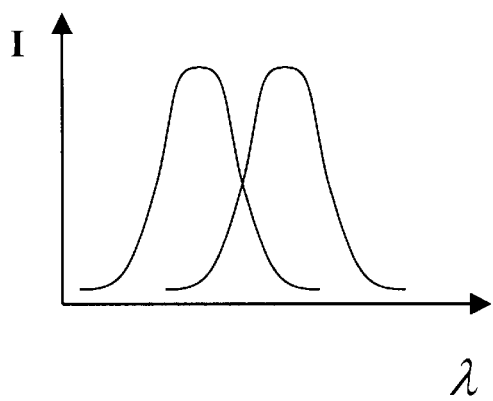
FIG. 4a is a simplified diagram illustrating the spectral response for each of the optical amplifiers of FIG. 3.

Referring to FIG. 4a, a typical spectral response for two different SOAs is shown. The SOAs are designed such that their central wavelength is offset one relative to the other. As noted with reference to FIG. 2a, the SOA has excellent amplification over a spectral band and the amplification trails off outside the band of wavelengths. Even within the band of wavelengths, the optical amplification is other than identical.

Figure 4B:
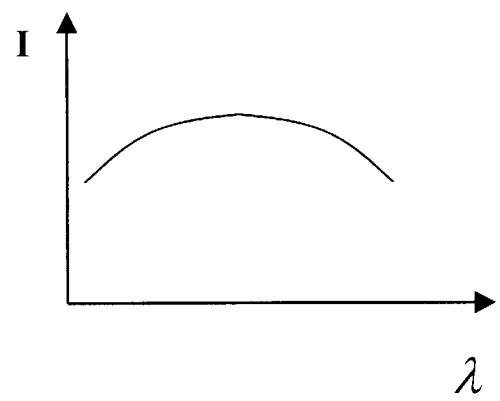
FIG. 4b is a simplified diagram illustrating the resultant spectral response of the two optical amplifiers of FIG. 3.
Figure 4C:
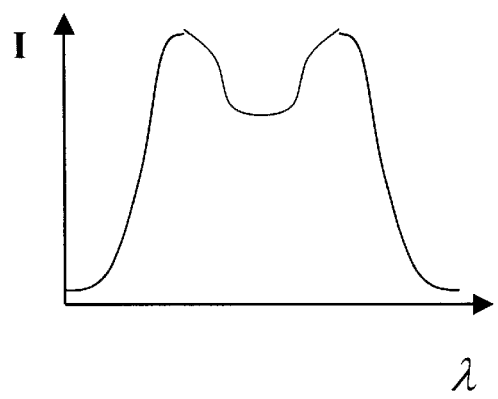
FIG. 4c is a simplified diagram illustrating the spectral response for the diffraction grating device of FIG. 3.
Figure 4D:
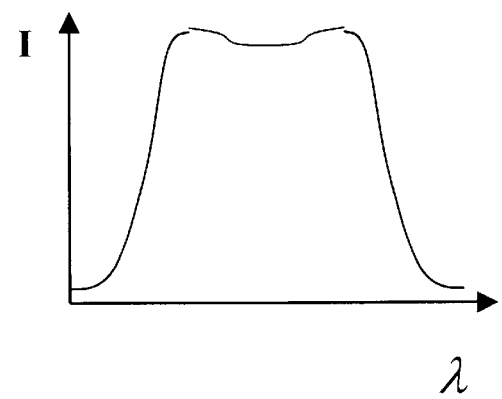
FIG. 4d is a simplified diagram illustrating the spectral response for the entire integrated waveguide device of FIG. 3.

In FIG. 4b is shown the combined spectral response of the two cascaded SOAs of FIG. 2. Here, a multiplication of the spectral responses results in a generally wide flattish spectral response having two peaks for the amplification of the input optical signal. In FIG. 4c, the spectral response of a diffraction grating is shown. For a typical diffraction grating, the center channels pass through with minimal loss while the outermost channels have approximately 3 dB of loss relative to the center channels. In FIG. 4d is shown the spectral response of the overall device 20 of FIG. 2. The response is the product of multiplication of the spectral response of FIG. 4b and the spectral response of FIG. 4c. Having the minimum between the two peaks of the spectral response of the two amplifiers—FIG. 4b coinciding with the maximum of the spectral response of the grating—FIG. 4c—results in a broad flat response across a wide range of wavelengths. Because the grating spectral response is easily estimated during design, the SOAs are designed to compensate for that spectral response to result in an overall flat spectral response of the device 20.

Figure 5:
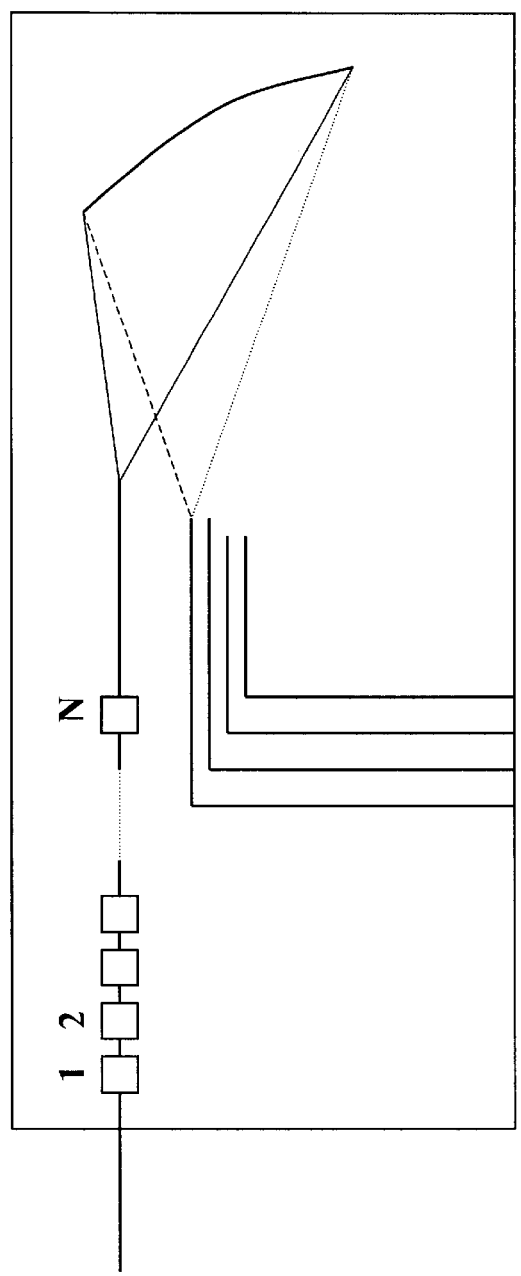
FIG. 5 is a simplified schematic diagram of an integrated semiconductor waveguide device according to the invention having N different optical amplifiers integral thereto and a diffraction grating device.
Figure 6A:
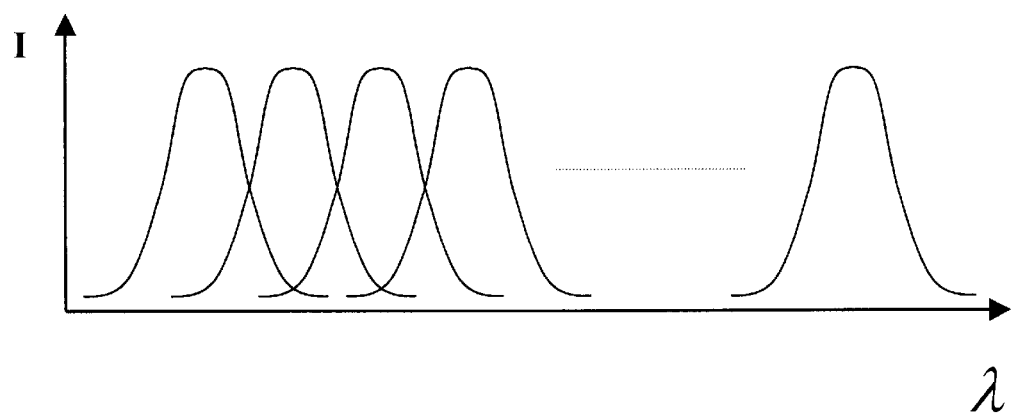
FIG. 6a is a simplified diagram illustrating the spectral response for each of the optical amplifiers of FIG. 5.
Figure 6B:
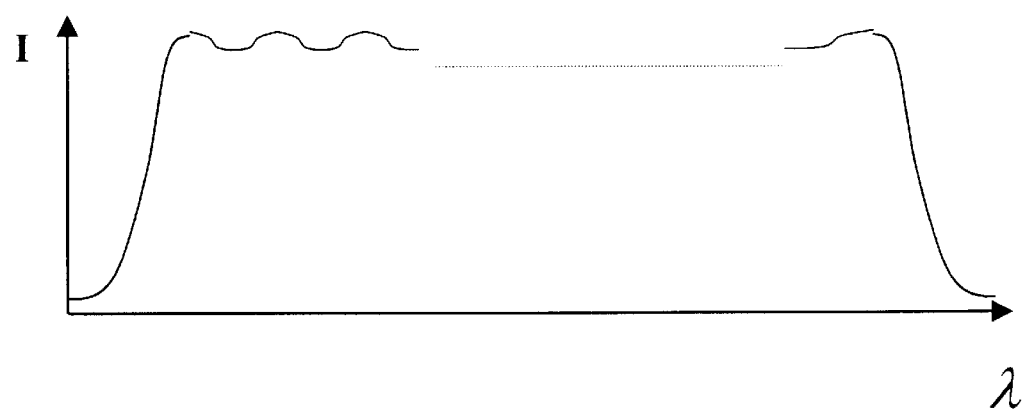
FIG. 6b is a simplified diagram illustrating the resultant spectral response of the N optical amplifiers of FIG. 5.

Referring to FIG. 5, a simplified schematic diagram of an integrated optical waveguide device 30 according to the invention including N cascaded optical amplifiers in the form of SOAs is shown. The N SOAs are selected to have different spectral responses as shown in FIG. 6a. A multiplication of the spectral response curves results in a spectral response having a flat response within a broad spectral range, as shown in FIG. 6b. Thus, amplification of the waveguide device is consistent across a large band of wavelengths. This is generally considered highly advantageous in the art. Using modern semiconductor technology it is possible to integrate a plurality of tens of SOAs in a single integrated optical waveguide device with the potential of further increase of the number of SOAs with further technological advancements. It is, therefore, possible to carefully design a cascade of SOAs to obtain a desired overall spectral response of an integrated optical waveguide device.

Figure 7A:
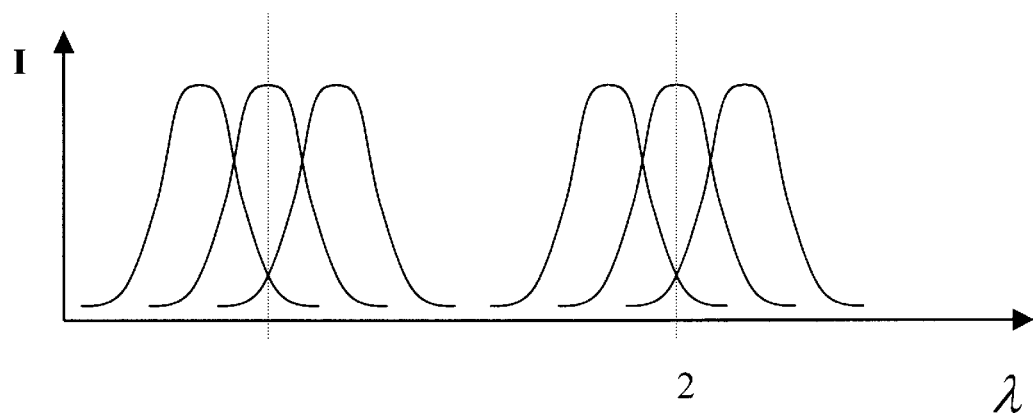
FIG. 7a is a simplified diagram illustrating another spectral response for each of the optical amplifiers of FIG. 5.
Figure 7B:
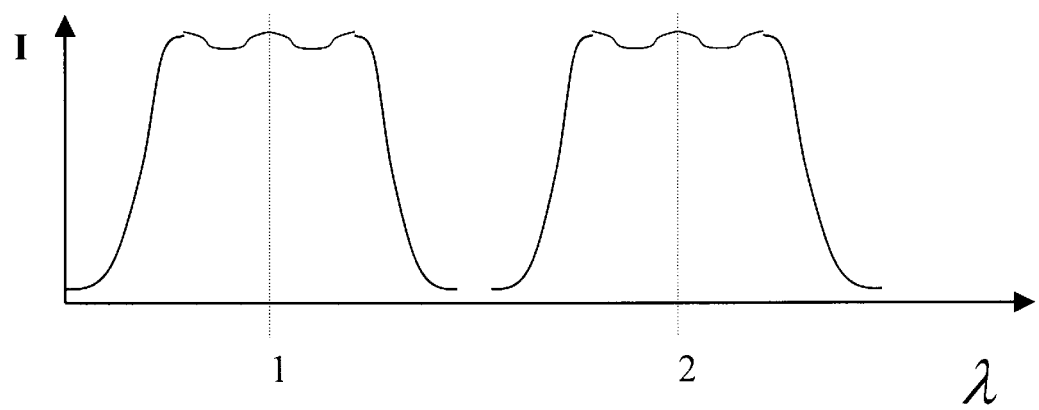

In another embodiment according to the invention the SOAs are designed such that their spectral responses correspond to wavelength channels. In the example shown in FIGS. 7a and 7b three SOAs having a different spectral response are used to amplify the signal of each wavelength channel 1, 2, . . . of an optical network having a center wavelength $\lambda_1$, $\lambda_2$, . . . , respectively. The product of multiplication of the spectral responses illustrated in FIG. 7b shows a flat response over the bandwidth of each channel and a clear separation between the channels. Of course, various numbers of SOAs per wavelength channel are applicable. In general, the greater the number of SOAs the better the possibilities for shaping the spectral response.

Optionally, a different number of SOAs for different wavelength channels is applied. For example, center channels are amplified using a smaller number of SOAs than outer channels requiring more amplification.

Figure 8:
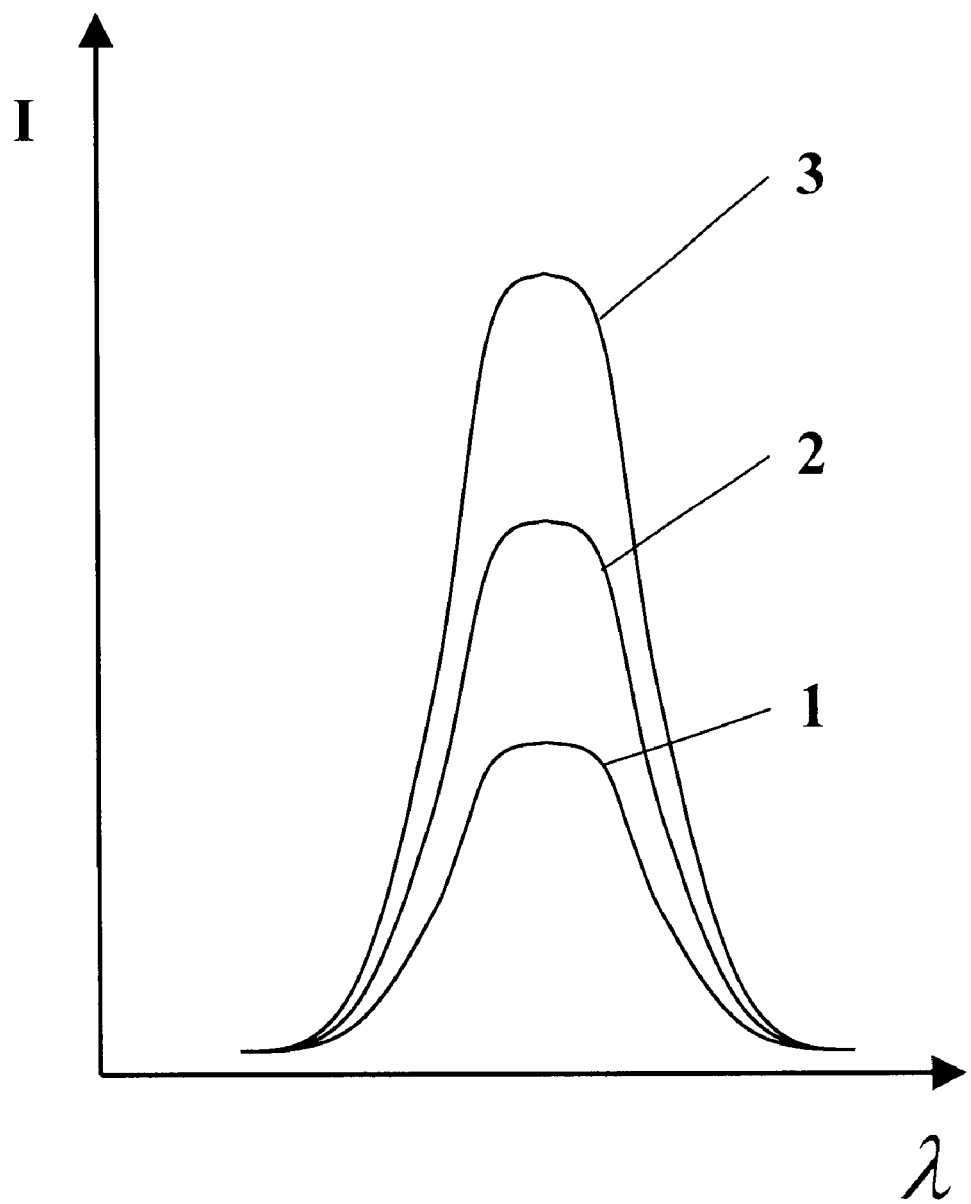
FIG. 8 is a simplified diagram illustrating the spectral response of one optical amplifier and the multiplied spectral response of two and three same spectral responses.

In another embodiment according to the invention SOAs having a same spectral response are cascaded. For example, FIG. 8 illustrates the spectral response of one SOA 1 and the multiplied spectral response of two SOAs 2 and three SOAs 3. Cascading SOAs having a same spectral response is advantageous if technical difficulties do not allow amplification in one step, for example, if a SOA having a large amplification produces too much heat causing undesirable thermal stress in the integrated optical waveguide device.

Figure 9A:
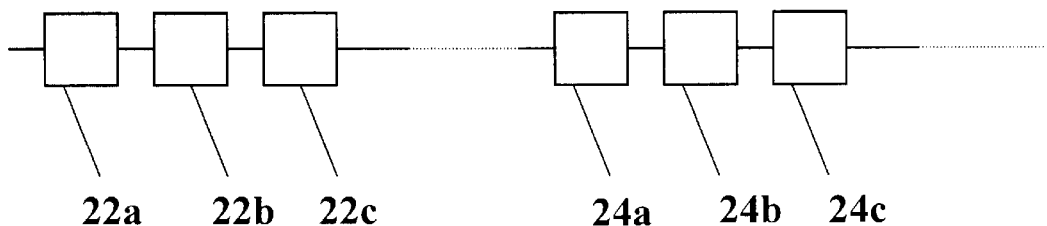
FIG. 9a is a simplified schematic diagram of an integrated semiconductor optical amplifier system according to the invention comprising a plurality of optical amplifiers combined with electro-absorptive attenuators.
Figure 9B:
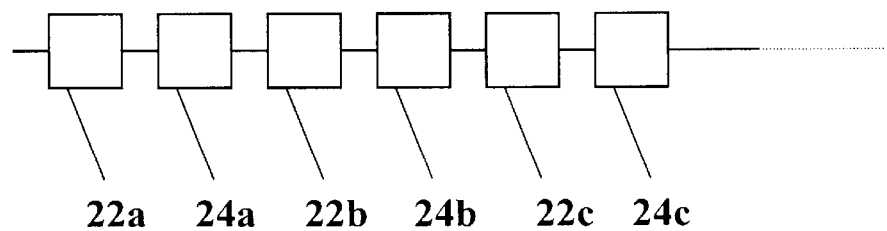
FIG. 9b is a simplified schematic diagram of an integrated semiconductor optical amplifier system according to the invention comprising a plurality of optical amplifiers combined with electro-absorptive attenuators.
Figure 9C:
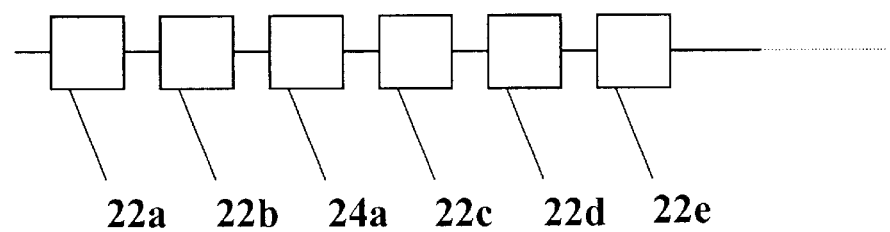
FIG. 9c is a simplified schematic diagram of an integrated semiconductor optical amplifier system according to the invention comprising a plurality of optical amplifiers combined with electro-absorptive attenuators.

Optionally, the cascaded SOAs 22a, 22b, 22c, . . . are combined with electro-absorptive attenuators (EAA)s 24a, 24b, 24c, . . . in order to increase flexibility for the spectral shaping as shown in FIGS. 9a, 9b, and 9c. However, since use of EAAs introduces a loss to the signal it is desirable to keep the use of EAAs to a minimum. As is evident, there are numerous other possibilities for combining cascaded SOAs and EAAs depending upon a desired spectral response. Additionally, it is also possible to use passive optical elements such as a filter disposed in the signal path for spectral shaping in combination with the cascaded SOAs.

Figure 10A:
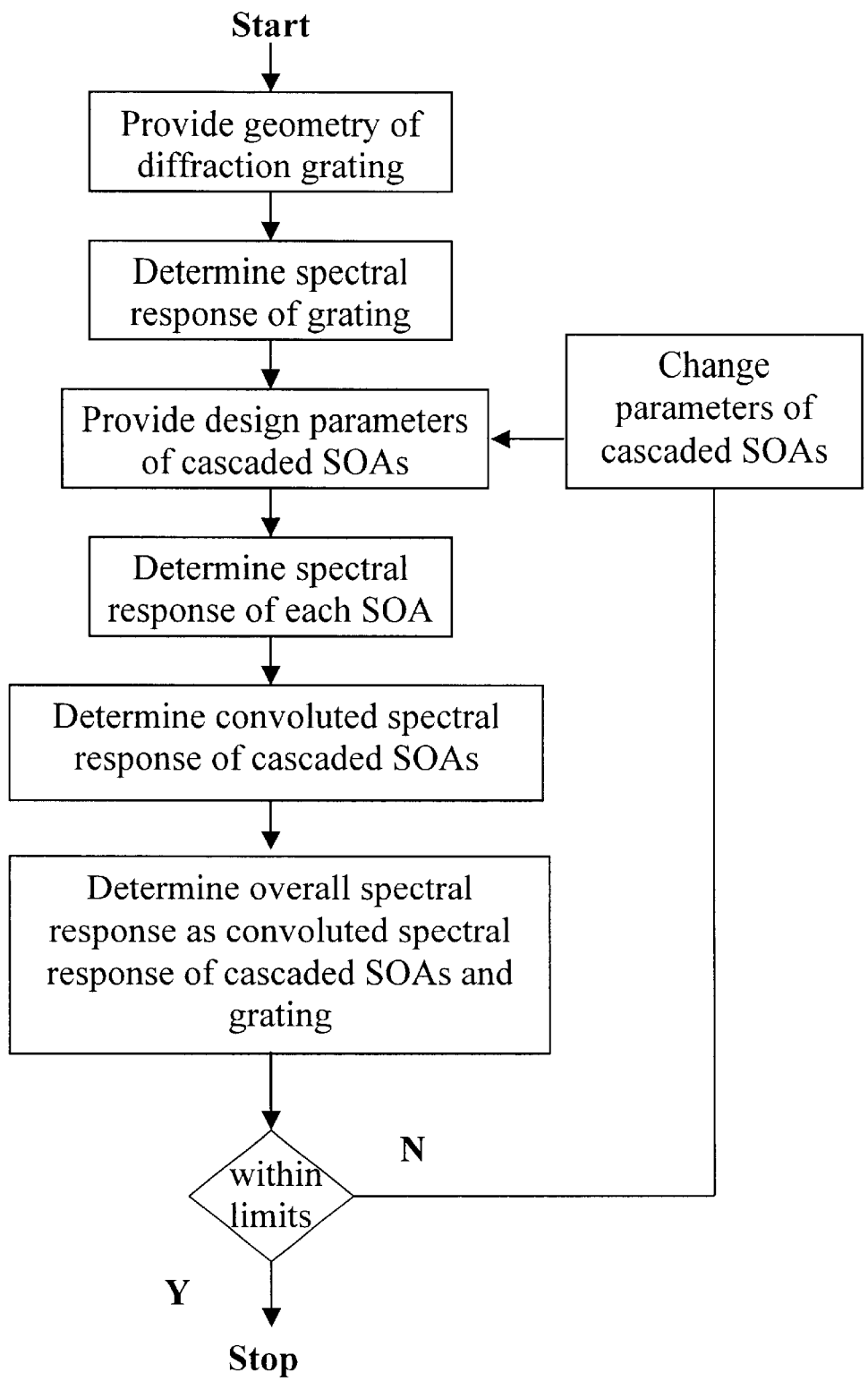
FIG. 10a is a simplified flow diagram of a method for iteratively designing an integrated semiconductor waveguide device according to the invention.
Figure 10B:
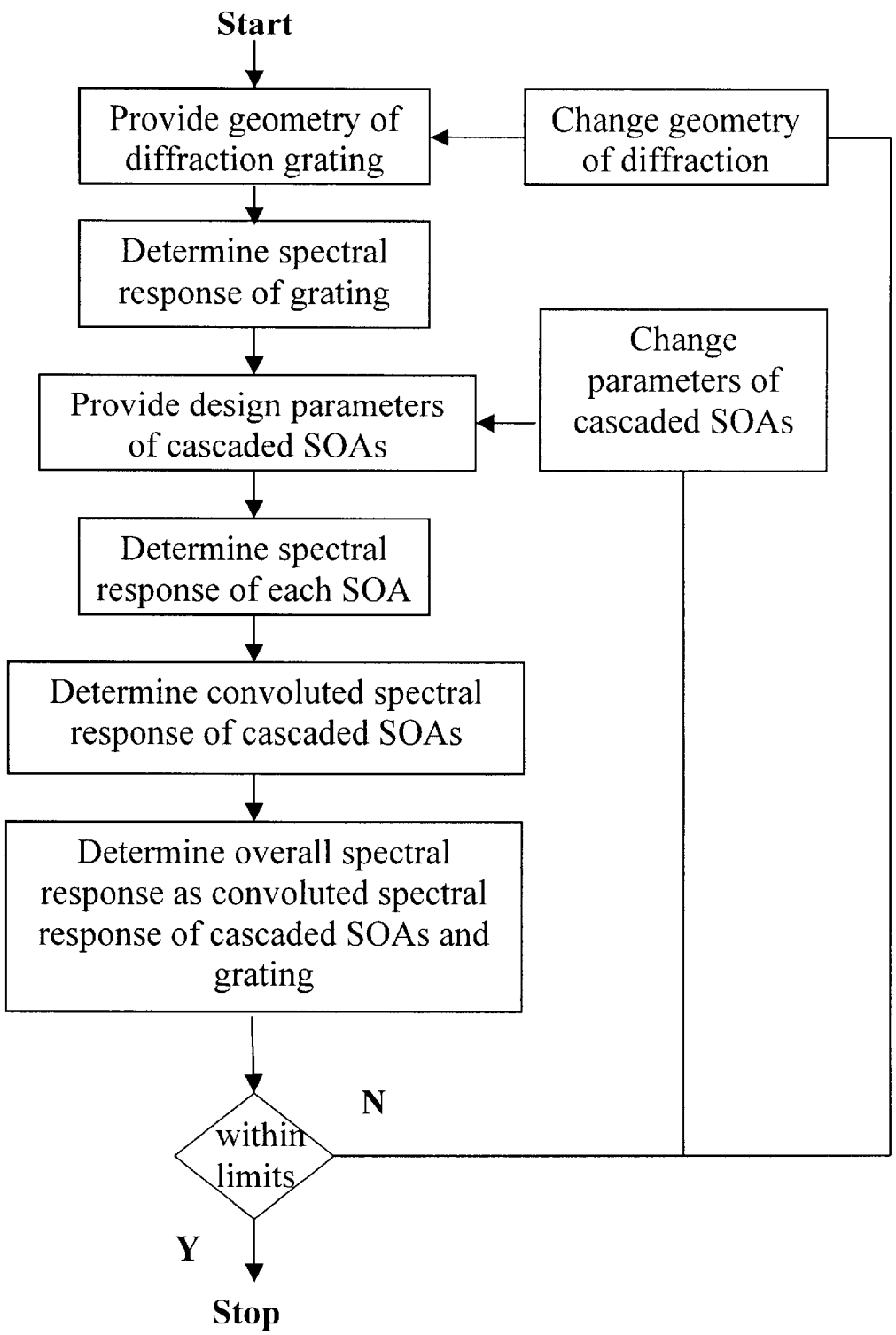
FIG. 10b is a simplified flow diagram of a method for iteratively designing an integrated semiconductor waveguide device according to the invention.

Referring now to FIG. 10a, a simplified flow diagram of a method for iteratively designing an integrated semiconductor waveguide device according to the invention is shown. As a starting point a diffraction grating having a given geometrical shape is provided. Furthermore, a plurality of cascaded SOAs having given different spectral responses is provided. In the following the spectral response of the diffraction grating and the multiplied spectral response of the plurality of cascaded SOAs are determined. Having the spectral responses of the diffraction grating and the cascaded SOAs the resultant overall spectral response of the SOAs combined with the diffraction grating is determined. In the next step the overall spectral response is evaluated and if the overall spectral response is not within predetermined limits the design of at least one SOA is changed in order to provide a different spectral response. Alternatively, the geometric shape of the diffraction grating is also changed during the iteration process as shown in FIG. 10b. In general, it is desired to obtain a substantially flat overall spectral response. However, this method also allows designing a device having another overall spectral response than a flat one. This is, for example, desirable if an input signal has a known non-ideal spectrum which is then taken into account in the design of the integrated optical waveguide device.

As is evident, the method according to the invention is not limited to the combination of cascaded SOAs with a diffraction grating but is also applicable for the combination of cascaded SOAs with other passive or active optical elements as long as it is possible to determine their spectral response.

Advantageously, variations in spectral response are evaluated to determine a best course of action for correcting same. Periodic variations within each wavelength channel are easiest to correct by changing the grating design. Peaks at specific non-periodic locations are easiest to change through variation in the amplifier design or through spectral shaping with non-periodic passive waveguide components.

Using the cascaded SOAs for optical amplification according to the invention is highly advantageous by providing a large number of design possibilities for shaping the spectral response of an integrated optical device without inducing a considerable increase in cost. Furthermore, it allows the combination with optical components having a less optimal spectral response but are easier and consequently cheaper to manufacture and use of the cascaded SOAs to produce a desired overall spectral response of the device.

Modern optical networks comprise more than twenty wavelength channels which are added or dropped using optical switching elements at a node in dependence upon network topology and data transmission. This results in many possible spectra of the transmitted signals in dependence upon use of the various channels. Therefore, proper amplification of the signals for all possible spectra over a wide wavelength bandwidth is a challenging task. Furthermore, for many network applications, especially for metropolitan networks, it is desirable that the system is scalable, for instance a small number of channels are added/dropped at a node initially but that number may be increased at a later time together with the total number of channels in the system, as demand on the network increases.

Referring to FIG. 11, a simplified schematic diagram of an integrated optical amplification system 40 according to the invention is shown. The system 40 is capable of amplifying numerous signals having different spectra using a limited number of SOAs. Here, a plurality of SOAs 102a, 102b, . . . are cascaded, as shown in FIG. 11. Each of the SOAs is operated in two modes ON and OFF producing two different spectral responses as shown in FIGS. 12a and 12b. Cascading of N SOAs having different spectral responses results in 2N different spectral responses of the N SOAs. Multiplying all possible combinations of the 2N different spectral responses of the cascaded SOAs results in $2^N$ different overall spectral responses of the cascaded SOAs. For example, cascading of 10 SOAs provides $2^{10}=1024$ different spectral responses of the cascaded SOAs in dependence upon the switching—ON/OFF—of each of the SOAs.

Figure 13:
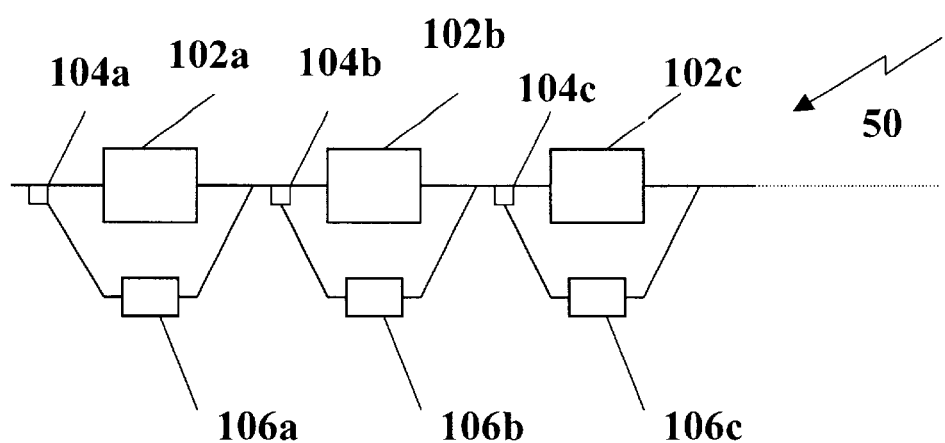
FIG. 13 is a simplified schematic diagram of an integrated optical amplification system according to the invention.

By further increasing the switching capability the number of different spectral responses for the cascaded SOAs is substantially increased for the same number of SOAs. In the embodiment of cascaded SOAs 50 shown in FIG. 13 the SOAs 102a, 102b, . . . are bypassed using optical switches 104a, 104b, . . . and filters 106a, 106b, . . . , respectively. Each combination of SOA and filter provides three different spectral responses in dependence upon the switching—optical switch and ON/OFF of the SOA. Assuming each filter has a different spectral response a cascade of N stages—SOA, filter, and optical switch—provides $3^N$ different overall spectral responses. For example, cascading of 10 stages provides $3^{10}=59049$ different spectral responses of the cascaded stages in dependence upon the switching.

Figure 14:
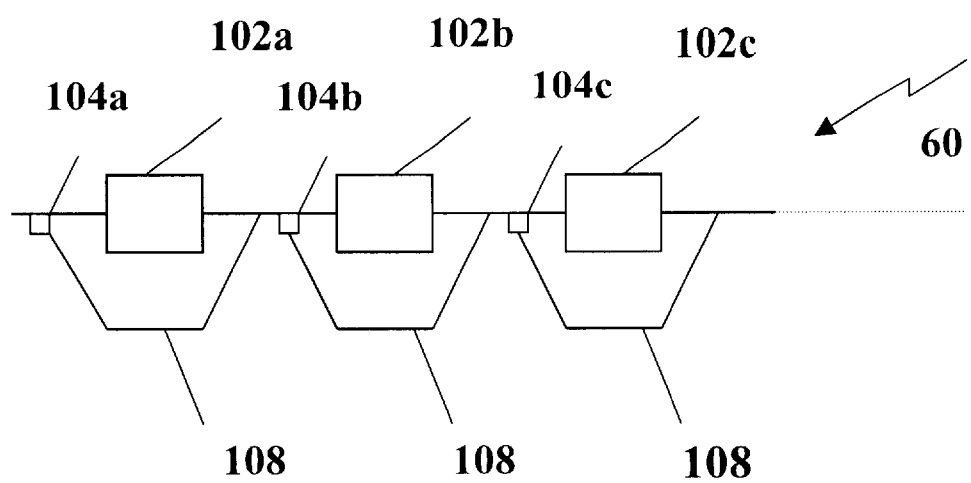
FIG. 14 is a simplified schematic diagram of an integrated optical amplification system according to the invention; and, FIG. 15 is a simplified schematic diagram of an integrated optical amplification system according to the invention.

Referring to FIG. 14 another embodiment 60 of cascaded SOAs is shown. Here, the SOAs are bypassed without a filter resulting in a somewhat simpler system. However, the number of different overall spectral responses is also reduced because all bypasses have a substantially same spectral response.

Figure 15:
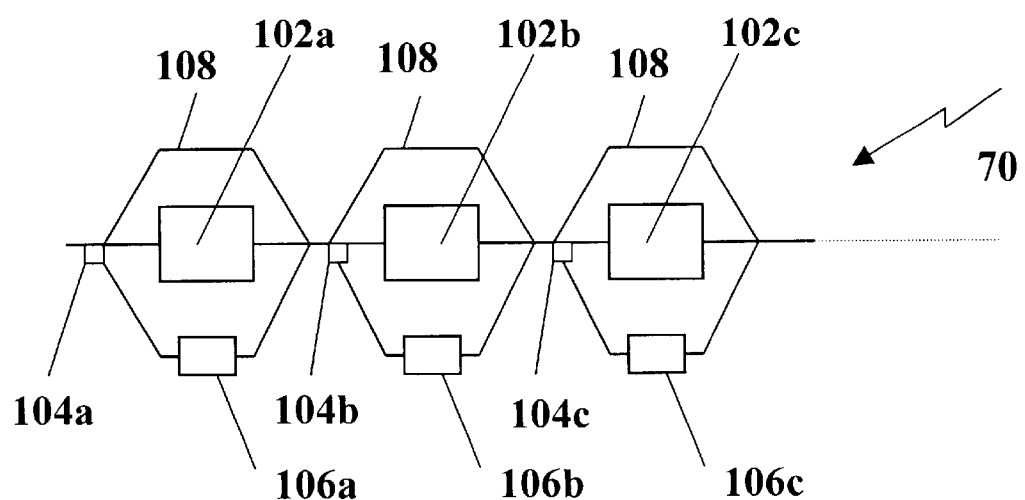

Referring to FIG. 15 yet another embodiment 70 of cascaded SOAs is shown. By combining the embodiments 50 and 60 the number of different spectral responses per stage and therefore the number of overall spectral responses is further increased compared to the embodiment 50.

As will be evident to those of skill in the art of digital system design, the use of 6 switched amplifiers each having a different spectral response allows for 64 different amplification spectral responses and intensities. Typically, not all of the responses are useful but, because of the extremely large number of available responses, it is likely that many will be useable when design considerations for amplification and for passive waveguide components are taken into account in the design and implementation process.

The integrated optical amplification systems according to the invention are highly advantageous for modern optical communication networks by providing a large number of different spectral responses in dependence upon the switching of the SOAs and the optical switches. For example, in the design stage all possible spectra expected at a node where the amplification system is to be located are determined and the parameters of the system—number of SOAs, spectral responses of the SOAs, and number and spectral responses of other possible optical components—are then determined in dependence thereupon. During operation the desired spectral response is then selected just by switching the SOAs and optical switches of the system accordingly. Furthermore, the amplification system according to the invention also allows anticipating future growth of a network. Due to the compact integrated design the system facilitates the anticipation of more spectra then presently used without a considerable increase in cost.

Numerous other embodiments of the invention will be apparent to persons skilled in the art without departing from the spirit and scope of the invention as defined in the appended claims.

What is claimed is:

1. A semiconductor optical amplifier system comprising:
   a semiconductor waveguide structure;
   a first semiconductor optical amplifier integrated in the semiconductor waveguide structure, the first semiconductor optical amplifier having a first spectral response; and,
   a second semiconductor optical amplifier integrated in the semiconductor waveguide structure and coupled for optically receiving an amplified optical signal from the first semiconductor optical amplifier, the second semiconductor optical amplifier having a second other spectral response, wherein the first and the second semiconductor amplifier are selected such that their spectral responses substantially compensate the effect of the spectral response of an optical element optically coupled thereto.

2. A semiconductor optical amplifier system as defined in claim 1, wherein the optical element comprises a diffraction grating.

3. A semiconductor optical amplifier system comprising:
   a semiconductor waveguide structure;
   a first semiconductor optical amplifier integrated in the semiconductor waveguide structure, the first semiconductor optical amplifier having a first spectral response;
   a second semiconductor optical amplifier integrated in the semiconductor waveguide structure and coupled for optically receiving an amplified optical signal from the first semiconductor optical amplifier, the second semiconductor optical amplifier having a second other spectral response; and, a third semiconductor optical amplifier coupled for optically receiving an amplified optical signal from the second semiconductor optical amplifier.

4. A semiconductor optical amplifier system as defined in claim 3, comprising an electro-absorptive attenuator optically coupled to the first and second semiconductor amplifier.

5. A semiconductor optical amplifier system comprising:
   a semiconductor waveguide structure;
   a first semiconductor optical amplifier integrated in the semiconductor waveguide structure, the first semiconductor optical amplifier having a first spectral response; and,
   a second semiconductor optical amplifier integrated in the semiconductor waveguide structure and coupled for optically receiving an amplified optical signal from the first semiconductor optical amplifier, the second semiconductor optical amplifier having a second other spectral response, wherein at least one of the first and the second semiconductor amplifiers is operable in two different modes providing two different spectral responses.

6. A semiconductor optical amplifier system comprising:
   a semiconductor waveguide structure;
   a first semiconductor optical amplifier integrated in the semiconductor waveguide structure, the first semiconductor optical amplifier having a first spectral response; and,
   a second semiconductor optical amplifier integrated in the semiconductor waveguide structure and coupled for optically receiving an amplified optical signal from the first semiconductor optical amplifier, the second semiconductor optical amplifier having a second other spectral response, wherein the first semiconductor amplifier is switchably coupled for controllably bypassing the first semiconductor amplifier in a first switch mode and for other than bypassing the first semiconductor amplifier in a second other mode.

7. A semiconductor optical amplifier system as defined in claim 6, wherein the second semiconductor amplifier is switchably coupled for controllably bypassing the second semiconductor amplifier in a first switch mode and for other than bypassing the second semiconductor amplifier in a second other mode.

8. A semiconductor optical amplifier system as defined in claim 6, comprising a passive optical element disposed within a bypass formed in the first switch mode.

9. An integrated semiconductor waveguide structure comprising:
   a first semiconductor optical amplifier for amplifying an optical input signal, the first semiconductor optical amplifier having a first spectral response;
   a second semiconductor optical amplifier coupled for optically receiving the amplified optical input signal from the first semiconductor optical amplifier, the second semiconductor optical amplifier having a second other spectral response; and,
   a demultiplexer optically coupled to the second semiconductor amplifier, the demultiplexer for separating the amplified optical input signal into a plurality of optical signals within different wavelength channels.

10. An integrated semiconductor waveguide structure as defined in claim 9, comprising a third semiconductor optical amplifier coupled for optically receiving an amplified optical signal from the second semiconductor optical amplifier.

11. An integrated semiconductor waveguide structure as defined in claim 9, wherein the first and the second semiconductor amplifier have different center wavelengths of their spectral response.

12. An integrated semiconductor waveguide structure as defined in claim 11, wherein the different centre wavelengths are selected such that an optical signal provided to the first semiconductor optical amplifier and amplified thereby and then provided to the second semiconductor optical amplifier and amplified thereby and separated into wavelength channels is amplified approximately a same amount across each channel of wavelengths as an amount of attenuation caused by the integrated semiconductor waveguide structure.

13. A method for designing an integrated semiconductor waveguide device comprising the steps of:

providing design parameters of an optical element of the integrated semiconductor waveguide device;

providing design parameters of a first and a second semiconductor optical amplifier optically coupled to the optical element;

determining a spectral response of the optical element in dependence upon the design parameters of the optical element;

determining a spectral response of the first and the second semiconductor optical amplifier; and, determining an overall spectral response by multiplying the spectral response of the optical element and the spectral responses of the first and the second semiconductor optical amplifier;

comparing the determined overall spectral response with a desired overall spectral response in order to obtain a comparison result and if the comparison result is not within predetermined limits performing the steps of:

changing the design parameters of at least one of the first semiconductor amplifiers, the second semiconductor amplifier, and the optical element; and, determining a new overall spectral response for the integrated semiconductor waveguide.

14. A method for designing an integrated semiconductor waveguide device as defined in claim 13, comprising the steps of:

changing the design parameters of at least one of the semiconductor optical amplifiers; and, determining a new spectral response of the at least one of the semiconductor optical amplifiers using the changed design parameters.

15. A method for designing an integrated semiconductor waveguide device as defined in claim 13, comprising the steps of:

changing the design parameters of the optical element; and, determining a new spectral response of the optical element using the changed design parameters.

16. A method for designing an integrated semiconductor waveguide device as defined in claim 15, wherein the optical element comprises a diffraction grating.

17. A method for designing an integrated semiconductor waveguide device as defined in claim 13, wherein the optical element comprises a diffraction grating.

18. A method for designing an integrated semiconductor waveguide device as defined in claim 13, wherein the optical element comprises a diffraction grating.

19. A method according to claim 18 wherein when a variation between the design parameters and the overall spectra response is indicative of periodic variations, varying the diffraction grating and when a variation between the design parameters and the overall spectra response is indicative of non-periodic variations, varying at least one of the semiconductor optical amplifiers.

* * * * *